(12) United States Patent
Genz et al.

(10) Patent No.: US 12,295,126 B2
(45) Date of Patent: May 6, 2025

(54) SYSTEM AND METHOD FOR TEMPERATURE MEASUREMENT IN DATA PROCESSING SYSTEMS

(71) Applicant: Dell Products L.P., Round Rock, TX (US)

(72) Inventors: Curtis Ray Genz, Round Rock, TX (US); Yu-Hung Wang, Tainan (TW); Nicole Mutesi, Round Rock, TX (US); Randy Alton Frazier, New Braunfels, TX (US); Donald W. Gerhart, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 233 days.

(21) Appl. No.: 18/047,825

(22) Filed: Oct. 19, 2022

(65) Prior Publication Data

US 2024/0138127 A1   Apr. 25, 2024
US 2024/0237306 A9   Jul. 11, 2024

(51) Int. Cl.
*H05K 7/20* (2006.01)
*G06F 9/44* (2018.01)
*H01L 23/34* (2006.01)

(52) U.S. Cl.
CPC .......... *H05K 7/20836* (2013.01); *G06F 9/44* (2013.01); *H01L 23/34* (2013.01); *H05K 7/20136* (2013.01); *H05K 7/20736* (2013.01)

(58) Field of Classification Search
None
See application file for complete search history.

(56) References Cited

U.S. PATENT DOCUMENTS

| | | | |
|---|---|---|---|
| 7,698,095 B2 | 4/2010 | Chung et al. | |
| 7,954,007 B2 * | 5/2011 | McMillan | H01L 23/34 |
| | | | 714/31 |
| 8,550,702 B2 | 10/2013 | Campbell et al. | |
| 9,158,345 B1 * | 10/2015 | Rice | H04L 41/0253 |
| 9,581,985 B2 | 2/2017 | Walser et al. | |
| 9,772,664 B1 | 9/2017 | Chou et al. | |
| 9,785,208 B2 | 10/2017 | Lovicott et al. | |
| 9,820,411 B2 | 11/2017 | Alshinnawi et al. | |
| 9,842,003 B2 | 12/2017 | Rao et al. | |
| 9,968,011 B2 | 5/2018 | Shabbir et al. | |
| 10,156,987 B1 | 12/2018 | Gutierrez et al. | |
| 10,191,523 B2 | 1/2019 | Shows et al. | |
| 10,394,294 B2 | 8/2019 | Pfeifer et al. | |
| 10,712,033 B2 | 7/2020 | Atchison et al. | |
| 10,760,809 B2 | 9/2020 | Gillette et al. | |

(Continued)

*Primary Examiner* — Courtney L Smith
(74) *Attorney, Agent, or Firm* — WOMBLE BOND DICKINSON (US) LLP

(57) ABSTRACT

Methods and systems for managing the operation of data processing systems are disclosed. A data processing system may include a computing device that may provide computer implemented services. To provide the computer implemented services, hardware components of the data processing system may need to operate in predetermined manners. To manage the operation of the hardware components, the data processing system may heat them when their temperatures fall outside of thermal operating ranges. To mitigate some risk associated with heating, the data processing system may proactively calibrate temperature sensors used to guide the heating process.

20 Claims, 7 Drawing Sheets

(56) References Cited

U.S. PATENT DOCUMENTS

| | | | |
|---|---|---|---|
| 10,922,260 B2 * | 2/2021 | Heyd | H05K 1/11 |
| 11,009,249 B2 | 5/2021 | Goel et al. | |
| 2008/0154536 A1 * | 6/2008 | McMillan | G06F 1/206 |
| | | | 702/132 |
| 2009/0018708 A1 * | 1/2009 | O'Neil | H01L 23/345 |
| | | | 700/300 |
| 2013/0015548 A1 | 1/2013 | Chen et al. | |
| 2014/0027435 A1 | 1/2014 | Chou | |
| 2016/0081231 A1 * | 3/2016 | Berke | G06F 1/206 |
| | | | 361/679.54 |
| 2022/0231599 A1 * | 7/2022 | Geske | H02M 1/08 |
| 2023/0135691 A1 * | 5/2023 | Rohrkemper | G06F 1/206 |
| | | | 700/300 |
| 2023/0221779 A1 * | 7/2023 | Adams | G06F 1/206 |
| | | | 700/300 |
| 2024/0134430 A1 * | 4/2024 | Gerhart | G05B 15/02 |

* cited by examiner

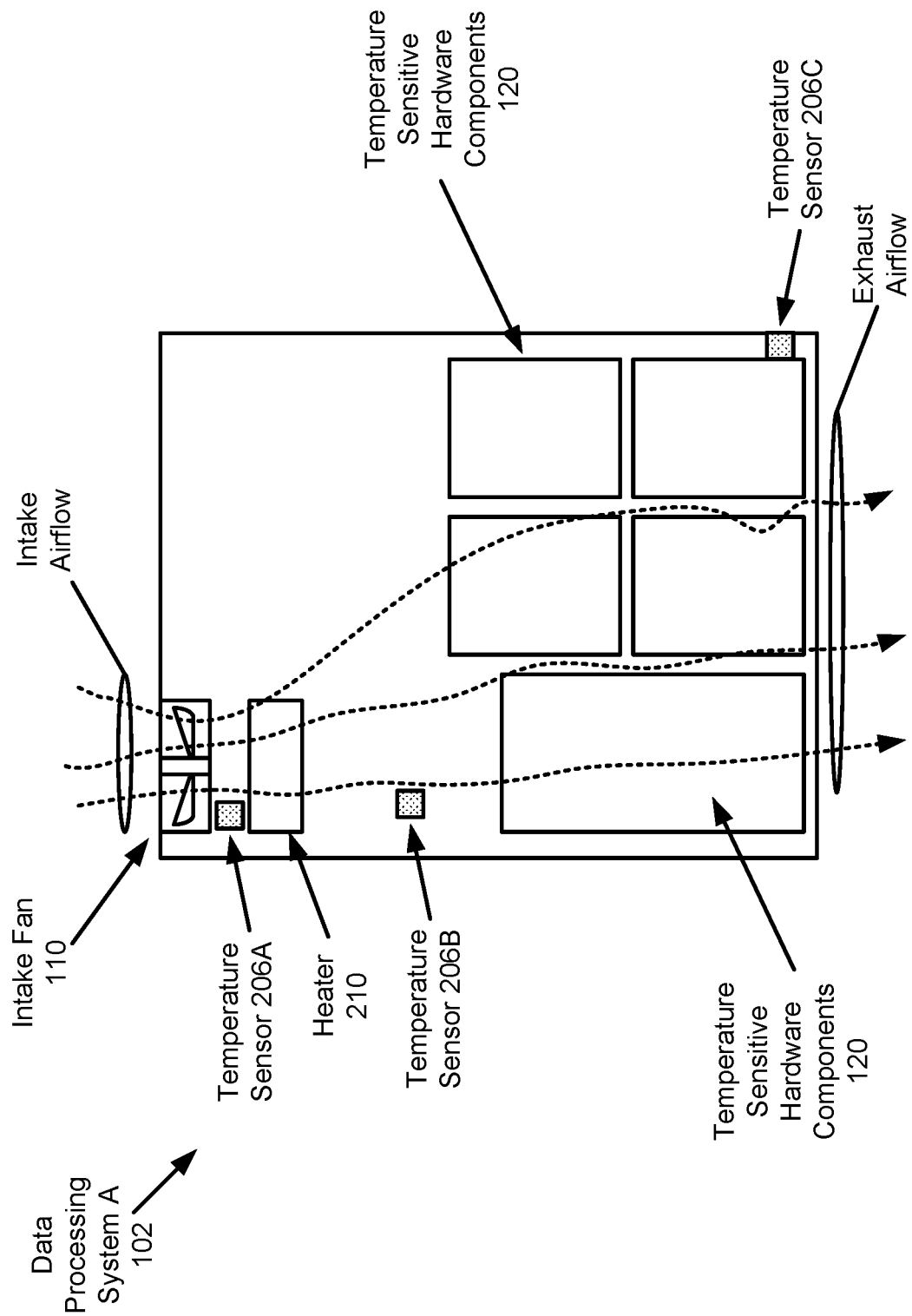

SYSTEM AND METHOD FOR TEMPERATURE MEASUREMENT IN DATA PROCESSING SYSTEMS

FIELD OF THE EMBODIMENTS

Embodiments disclosed herein relate generally to device management. More particularly, embodiments disclosed herein relate to systems and methods to proactively place hardware components in condition for their operation.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

FIG. 1B shows a top view diagram illustrating a system in accordance with an embodiment.

DETAILED DESCRIPTION

Figure 1A:
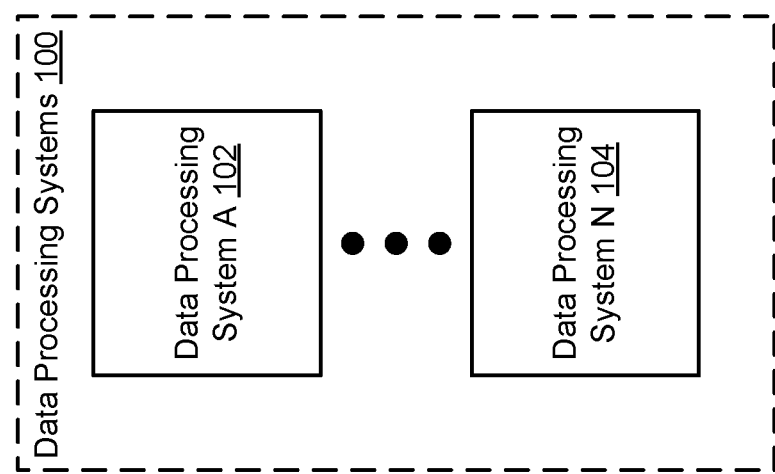
FIG. 1A shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable devices. In the context of a static device, "adapted to" may indicate that the device include circuitry to perform the functionality described with respect to the static devices.

In general, embodiments disclosed herein relate to methods and systems for managing the operation of data processing system. The data processing system may provide computer implemented services.

To provide the computer implemented services the data processing system may include various hardware components. The hardware components may have thermal operating limits that must be met for the hardware components to operate nominally (e.g., with low probability of error, low chance of damage/failure, etc.).

To maintain the hardware components within the thermal operating limits, the data processing system may include a thermal management subsystem. The thermal management subsystem may include a heater that may generate heat to warm the hardware components when they are below their thermal operating limits.

To manage the operation of the heater, the thermal management subsystem may include a temperature sensor. The temperature sensor may be used to attempt to measure a temperature of an ambient environment (and/or temperature of gasses brought into the data processing system). However, transient thermal effects (e.g., caused by heating by the heater) may prevent the temperature sensor from measuring a temperature of the ambient environment.

To manage the impact of transient thermal effects, the thermal management subsystem may include a thermal manager. The thermal manager may perform a calibration process to mitigate the impact of transient thermal effects on the temperature measurements made by the temperature sensor.

By doing so, embodiments disclosed herein may provide a data processing system capable of operating under a wider array of environment conditions by mitigating (e.g., reducing, limiting, etc.) the impact of transient thermal effects (e.g., warm components that may cool over time) on temperature measurements. Thus, embodiments disclosed herein may address the technical problem of operating condition limitations of data processing systems. The disclosed embodiments may address this problem by providing a data processing system with active heating capabilities (e.g., usable to warm components that may otherwise be inoperable thereby robbing the data processing systems of some of their capabilities) that also proactively mitigates risk associated with transient thermal effects due to the heating.

In an embodiment, a data processing system that provides computer implemented services is provided. The data processing system may include a heater positioned to, while powered, selectively warm a flow of a gas directed to warm a temperature sensitive hardware component of the data processing system; a temperature sensor positioned to identify an ambient temperature; a fan adapted to selectively generate the flow of the gas; a thermal manager adapted to: identify a startup of the data processing system; based on the identified startup: perform a calibration of the temperature sensor using the fan to eliminate transitory temperature effects on the ambient temperature identified by the temperature sensor to obtain a calibrated temperature sensor; obtain a temperature measurement of the ambient temperature using the calibrated temperature sensor; select a warming procedure based on the temperature measurement; perform the selected warming procedure using the heater and the fan to attempt to warm at least the temperature sensitive hardware component to meet a thermal operating limit of the temperature sensitive hardware component; and initiate operation of the temperature sensitive hardware component after completing the warming procedure to provide, at least in part, the computer implemented services.

The thermal manager may also be adapted to, prior to identifying the startup of the data processing system: attempt to perform a previously selected warming procedure until an unexpected operation of the data processing system aborts the performance of the previously selected warming procedure, the previously selected warming procedure introducing the transitory temperature effects on the ambient temperature identified by the temperature sensor.

The unexpected operation may initiate performance of the startup of the data processing system.

Performing the calibration of the temperature sensor may include activating the fan to generate the flow of the gas; and waiting a predetermination duration of time while the heater is inactive and the flow of the gas traverses proximate to a portion of the data processing system positioned with the temperature sensor to cool the portion of the data processing system to the ambient temperature.

Performing the calibration of the temperature sensor may include activating the fan to generate the flow of the gas; obtaining a first calibration temperature measurement using the temperature sensor while the flow of the gas is generated and the heater is inactive; waiting a period of time while the heater is inactive and the flow of the gas traverses proximate to a portion of the data processing system positioned with the temperature sensor to attempt to cool the portion of the data processing system to the ambient temperature; after waiting the period of time, obtaining a second calibration temperature measurement using the temperature sensor; and making a determination regarding whether the transitory temperature effect has been mitigated to a desired degree based on the first calibration temperature measurement and the second calibration temperature measurement.

Performing the calibration of the temperature sensor may also include in a first instance of the determination where the transitory temperature effect has not been mitigated: waiting a second period of time while the heater is inactive and the flow of the gas traverses proximate to the portion of the data processing system positioned with the temperature sensor to attempt to cool the portion of the data processing system to the ambient temperature; after waiting the second period of time, obtaining a third calibration temperature measurement using the temperature sensor; and making a second determination regarding whether the transitory temperature effect has been mitigated to the desired degree based on the second calibration temperature measurement and the third calibration temperature measurement.

Selecting the warming procedure based on the temperature measurement may include matching a temperature indicated by the temperature measurement to the warming procedure from a plurality of warming procedures, each of the warming procedures of the plurality of warming procedures being associated with a corresponding temperature, and each of the procedures of the plurality of warming procedures being based on a presumption that the ambient temperature matches the temperature indicated by the temperature measurement.

In an embodiment, a computer-implemented method is provided. The computer-implemented may provide the functionality of the data processing system and/or components thereof, discussed above.

In an embodiment, a non-transitory media is provided. The non-transitory media may include instructions that when executed by a processor cause the computer-implemented method to be performed.

Turning to FIG. 1A, a block diagram illustrating a system in accordance with an embodiment is shown. The system shown in FIG. 1A may provide any quantity and type of computer implemented services. To provide the computer implemented services, the system of FIG. 1A may include data processing systems 100.

All, or a portion, of data processing systems 102-104 may provide computer implemented services to users and/or other computing devices operably connected to data processing systems 100. The computer implemented services may include any type and quantity of services including, for example, database services, instant messaging services, video conferencing services, etc. Data processing systems 100 may provide other types of computer implemented services without departing from embodiments disclosed herein. Data processing systems 100 may each provide similar and/or different computer implemented services, and any of data processing systems 100 may provide any of the computer implemented services in cooperation with other data processing systems and/or independently.

To provide computer implemented services, data processing systems 100 may need to operate in a predetermined manner. The predetermined manner of operation may include, for example, executing an operating system, drivers, and/or other type of management entities that mediate, facilitate, or otherwise operate in a manner which enables the applications to operate (e.g., by providing abstracted access to hardware resources used in the execution of the applications).

To operate in the predetermined manner, data processing systems 100 may perform one or more operations to enter the predetermined manner of operation (by changing from other manners of operation to the predetermined manner of operation). These operations may include, for example, a boot process from a power-on (or reset or other manner of operation that differs from the predetermined manner of operation to the extent that the applications may not be able to operate) to hand off operation management of the data processing system to an operating system or other type of operational management entity that places data processing systems 100 into the predetermined manner of operation. The operating system may, for example, provide abstracted access to resources (e.g., processing resources provided by processors, memory resource provided by memory modules, storage resources provided by storage devices, etc.) utilized by the applications hosted by the data processing system.

For example, consider a scenario where a data processing system has been shut off. After the data processing system is turned on, the data processing system may be operating in a startup manner such that the data processing system is not yet able to support execution of an application (e.g., the application may not be able to successfully execute until the data processing system hosts an operating system or other type of management entity). To enter the predetermined manner of operation conducive to execution of the application, the data processing system may go through a boot process (e.g., a startup) which may be performed by one or more types of management entity such as a basic input-output system and/or other startup management entities. The management entity may perform any number of actions (e.g., a "startup process") to prepare the data processing system to begin execution of an operating system and/or other type of management entity that facilitates execution of applications.

To perform the startup process and provide the computer implemented services, data processing systems 100 may include various hardware components (e.g., integrated circuit-based devices). The hardware components may perform various types of functionalities including, for example, (i) data processing functionality through which the computer implemented services may be provided, (ii) system management functionality through which the operation of the respective data processing systems may be managed, and/or (iii) other types of functionalities.

Any of the hardware components may have limitations on their operation. For example, any of the hardware components may have limitations regarding their temperatures (e.g., hardware components having such limitations being referred to as "temperature sensitive hardware components"). The temperature limitations may include a lower temperature limit and an upper temperature limit. If the temperature of the temperature sensitive hardware components is outside of these limitations, then the temperature sensitive hardware components may be impaired (e.g., may not operate, may operate but in an undesirable manner such as including errors in their operation, may be subject to damage if operated, etc.).

In general, embodiments disclosed herein relate to systems, devices, and methods for improving the likelihood that data processing systems 100 are able to provide their computer implemented services. To improve the likelihood that data processing systems 100 are able to provide their computer implemented services, data processing systems 100 may include functionality to warm and cool hardware components.

For example, data processing systems 100 may include heaters and fans. The heaters and fans may be used to generate flows of gasses (e.g., from an ambient environment, from a particular source, etc.). The flows of gasses may be heated by a heater, and/or obtained from a source of cool gas to provide for warming or cooling flows of gasses usable to warm or cool temperature sensitive hardware components.

To decide when and how to generate flows of gasses to warm or cool hardware components, data processing systems 100 may be preprogrammed with procedures for heating or cooling depending on the ambient temperature of the environment in which data processing systems 100 reside. The procedures may be associated with different ambient temperatures. Data processing systems 100 may select one of the heating procedures by matching a measurement of the ambient temperature to an ambient temperature associated with one of the procedures. The procedures may specify, for example, for what duration and in which manner heaters and fans are to be operated prior to initiating operation of temperature sensitive hardware components.

However, if the temperature measurement performed by data processing systems 100 does not accurately reflect the ambient temperature, then a procedure that is less likely to warm and/or cool the temperature sensitive hardware devices to be within their operating temperature ranges may be selected and implemented. Doing so may, for example, reduce the likelihood of data processing systems 100 providing the desired computer-implemented services (e.g., by causing the temperature sensitive hardware devices to fail to operate, to become damaged, to introduce errors in their operation, etc.).

For example, consider a scenario where a data processing system is powered off. While powered off, the data processing system may cool until it reaches the ambient temperature. In this example scenario, presume that the ambient temperature is below the lower temperature of a temperature sensitive hardware component. Now, when the data processing system is powered on, the data processing system may make a temperature measurement using a temperature sensor that is at the ambient temperature. The measurement may cause the data processing system to begin to perform a procedure that includes activating a heater and a fan prior to initiating operation of the temperature sensitive hardware component. However, if, during the procedure, the data processing systems restarts, then a subsequent temperature measurement performed by the data processing system may be inaccurate due to transient thermal effects of the heat generated by the heater.

For example, operating the heater may have warmed portions of the data processing system proximate to the temperature sensor that have some thermal mass thereby increasing the temperature of the local environment in which the temperature sensor is positioned, when compared to the ambient temperature. If a temperature measurement is made under these circumstances, then the temperature measurement may not reflect the actual ambient temperature and cause the data processing system to implement a procedure that is less likely to warm the temperature sensitive hardware component to be within its operating temperature range (e.g., range of temperatures in which a component may operate nominally).

Figure 1C:
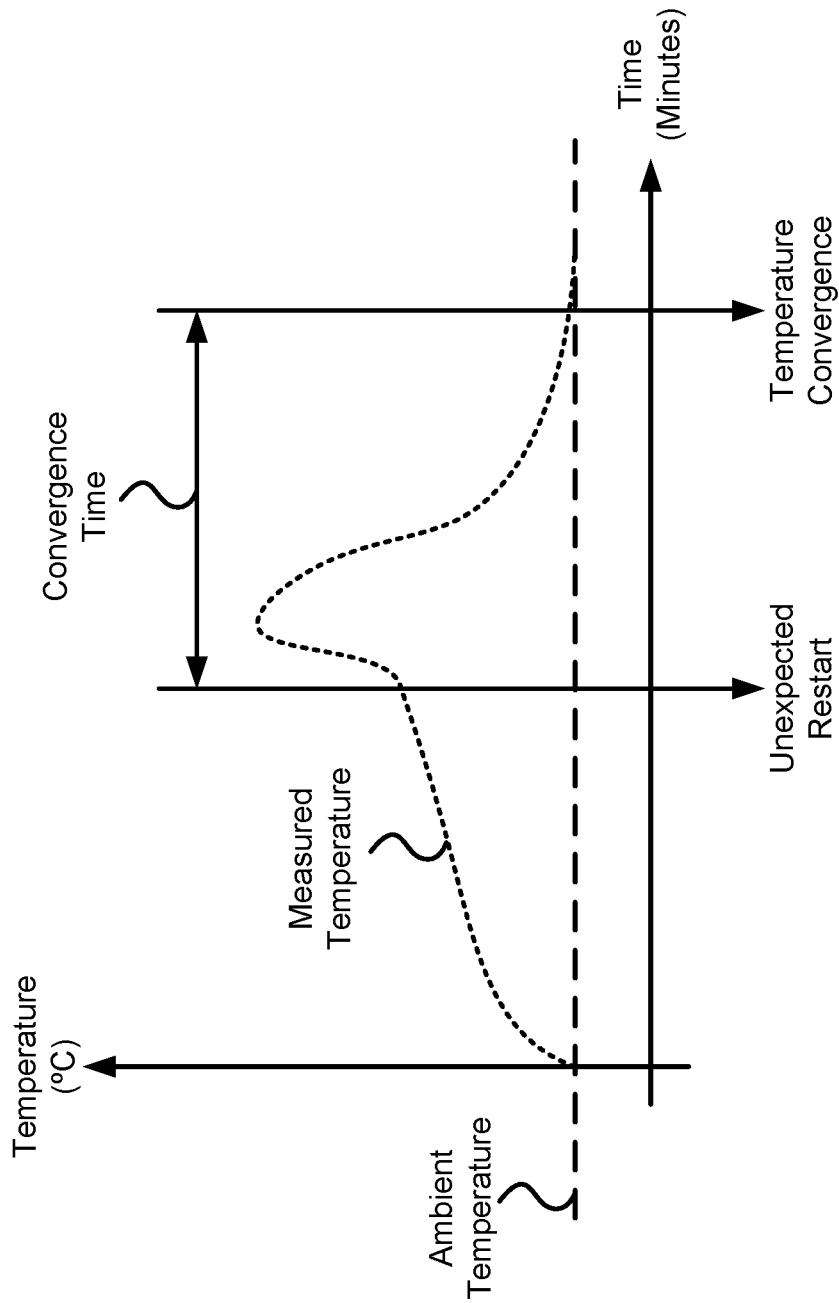
FIG. 1C shows a plot of a temperature in accordance with an embodiment.

To improve the likelihood of accurately measuring the temperature of the ambient environment, data processing systems 100 may implement a calibration procedure prior to attempting to measure the temperature of the ambient environment. The calibration procedure may substantially remove transient heating effects from temperature measurements. Refer to FIGS. 1B-1C for additional details regarding warming of data processing systems and temperature measurements.

By doing so, a data processing system in accordance with an embodiment may be more likely to successfully place itself in condition for providing desired computer implemented services under a wider variety of operating conditions. Thus, embodiments disclosed herein may address the technical challenge of limited operating conditions of components of data processing systems. The disclosed data processing systems may represent an improvement in computing technology by being more likely to successfully operate in varying operating conditions, and, in particular, in environment where ambient conditions may otherwise preclude operation of components of data processing systems.

Figure 2:
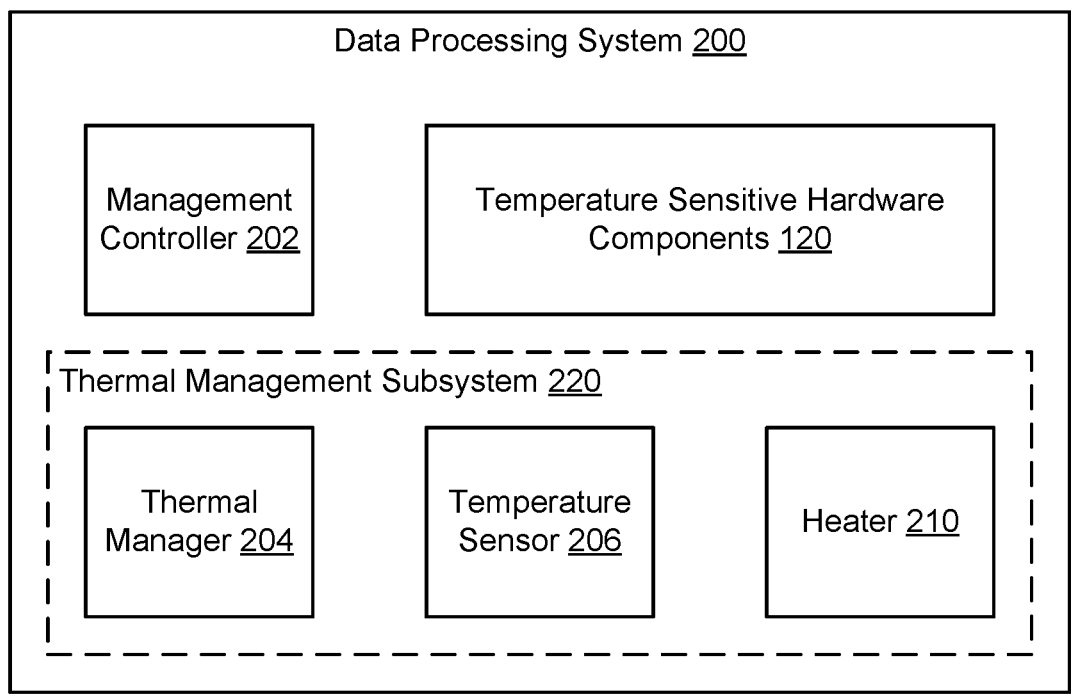
FIG. 2 shows a block diagram illustrating a data processing system in accordance with an embodiment.
Figure 3A:
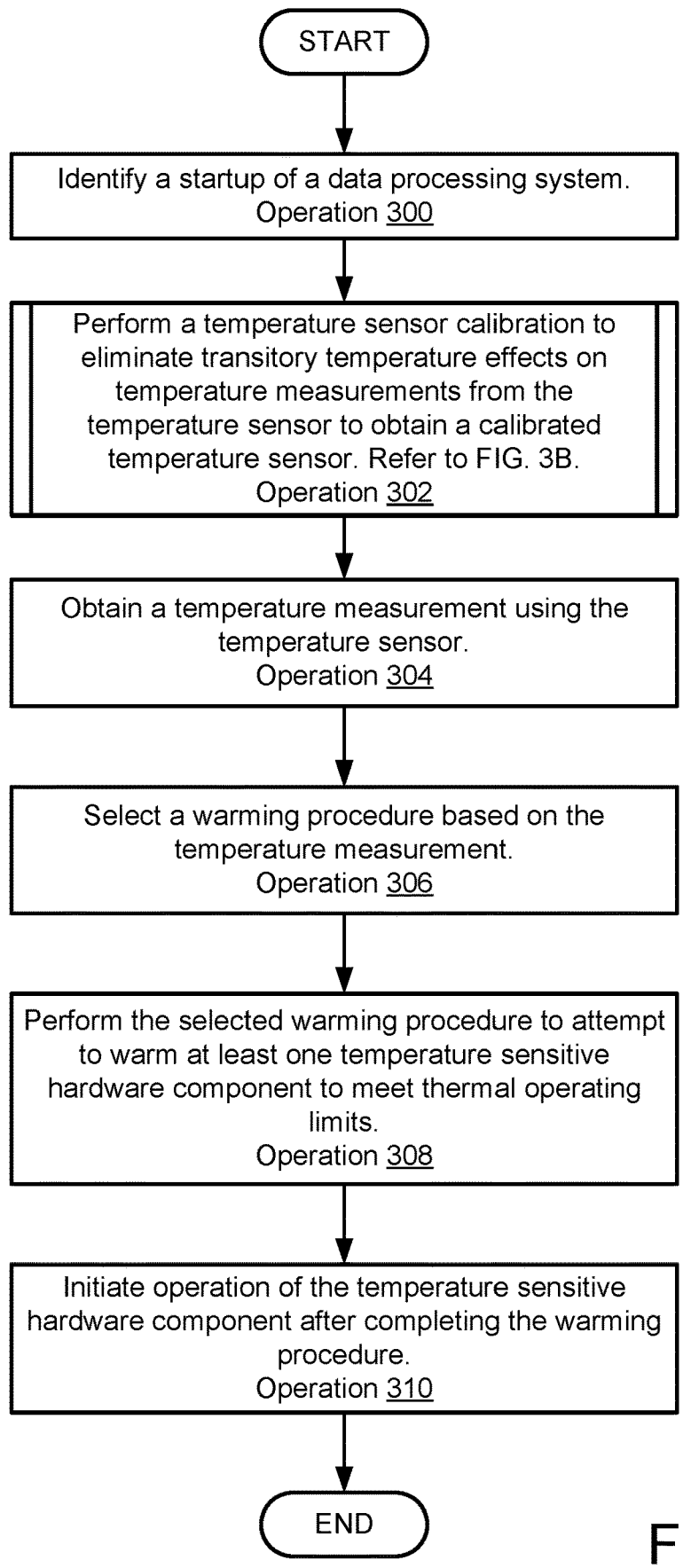
FIG. 3A shows a flow diagram illustrating a method of providing computer implemented services with a data processing system in accordance with an embodiment.
Figure 3B:
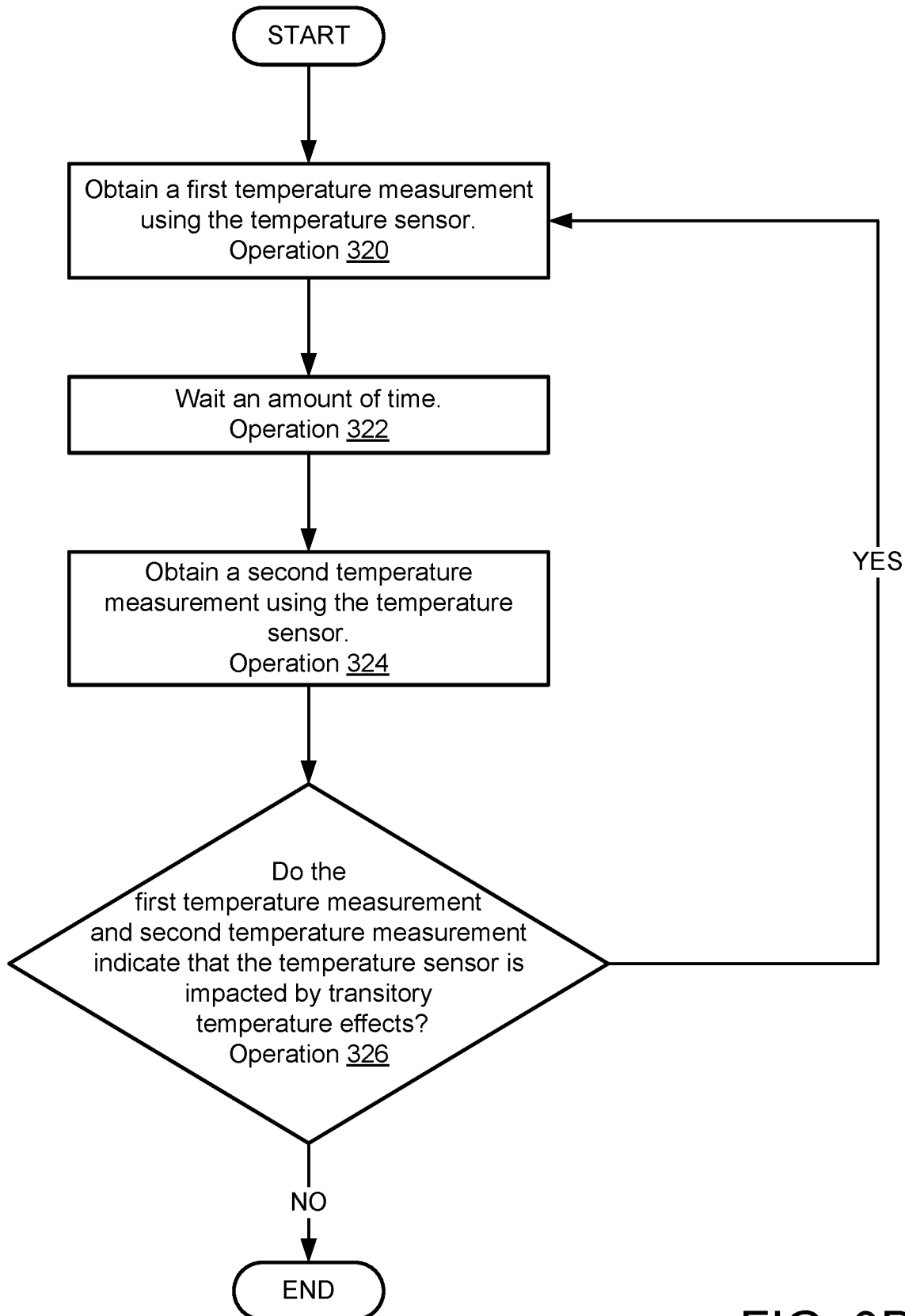
FIG. 3B shows a flow diagram illustrating a method of calibrating a temperature sensor in accordance with an embodiment.

When providing their functionalities, any of data processing systems 100 may perform all, or a portion, of the methods illustrated in FIGS. 3A-3B. Refer to FIG. 2 for additional details regarding data processing systems.

Any of data processing systems 100 may be implemented using a computing device such as a host or server, a personal computer (e.g., desktops, laptops, and tablets), a "thin" client, a personal digital assistant (PDA), a Web enabled appliance, a mobile phone (e.g., Smartphone), and/or any other type of computing device or system. For additional details regarding computing devices, refer to FIG. 4.

The system of FIG. 1A may include any number and types of data processing systems 100. Any of the aforementioned devices may operate independently and/or cooperatively to provide computer implemented services. Data processing systems 100 may provide such services to, for example, user of the data processing systems 100, to other data processing systems 100, and/or to other devices not shown in FIG. 1A.

Data processing systems 100 may be operably connected to any of each other and/or other devices via a communication system (not shown). The communication system may include one or more networks that facilitate communication between data processing systems 100 (or portions thereof) and/or other devices. The networks may include, for example, wired networks, wireless network, public networks, private network, the Internet, etc.

While illustrated in FIG. 1A as included a limited number of specific components, a system in accordance with an embodiment may include fewer, additional, and/or different components than those illustrated therein.

As noted above, data processing systems may be positioned in ambient environments where they may be exposed to ambient temperatures outside of the operating temperature ranges of the components of the data processing systems. To facilitate operation of data processing systems in such environment, warmed flows of gasses may be used to place temperatures of components of data processing systems within the operating temperatures of the components. FIG. 1B shows an example of airflows (e.g., flows of any types of gasses) that may be used to warm components of data processing systems, and FIG. 1C shows a diagram illustrating potential transient thermal impacts due to warming of the components.

Turning to FIG. 1B, a top view diagram of data processing system A 102 in accordance with an embodiment is shown. Any of data processing systems 100 may be similar to data processing system A 102.

As seen in FIG. 1B, data processing system A 102 may include any number of temperature sensitive hardware components 120. Temperature sensitive hardware components 120 may have limited thermal operating ranges.

To warm temperature sensitive hardware components 120 to be within their thermal operating ranges, data processing system A 102 may include intake fan 110, heater 210, and one or more temperature sensors (e.g., 206A-206C).

Heater 210 may selectively heat a flow of gas (illustrated in FIG. 1B with dashed lines terminating in arrows). The flow of gas may traverse proximate to one or more of temperature sensitive hardware components 120 thereby allowing them to be warmed.

Intake fan 110 may selectively (e.g., at different points in time, under the direction of other components) generate the flow of gas. Intake fan 110 may be implemented with, for example, an electrical motor, fan blades, a housing, etc.

To manage heating using heater 210 and intake fan 110, data processing system A 102 may include one or more temperature sensors (e.g., 206A-206C). The temperature sensors may be used, for example, to (i) attempt to measure the temperature of an ambient environment (e.g., and the temperature of gas likely to be brought in via the intake airflow generated by intake fan 110), (ii) attempt to measure the temperature of some components, and/or (iii) attempt to measure other temperatures relevant to the operation of data processing system A 102.

However, due to the limited number, positioning, and proximity to other components of the temperature sensors, temperature sensors 206A-206C may not be able to fully characterize the thermal states of all of temperature sensitive hardware components 120. Rather than attempting to fully characterize the thermal state of all of the temperature sensitive hardware components 120 (e.g., to verify that they are within their operating temperature ranges), data processing system A 102 may be preprogrammed with procedures for operating intake fan 110 and heater 210 under various ambient temperatures to warm temperature sensitive hardware components 120 to be within their thermal operating ranges.

For example, various potential procedures may be performed in a laboratory setting where data processing system A 102 is placed in a predetermined ambient environment. While in the environment, various potential procedures (e.g., operating the heater/fan at certain rates for certain durations of time) may be implemented until one that successfully warms all (or a prescribed number) of the temperature sensitive hardware components to be within their operating temperature ranges (e.g., from the ambient temperature) is identified. The aforementioned process may be repeated for different ambient temperatures until a range of procedures corresponding to different ambient temperatures are obtained.

At least one of temperature sensors 206A-206C may be positioned to attempt to sample a temperature of the ambient environment. For example, temperature sensor 206A may be positioned proximate to intake fan 110 through which gasses from the ambient environment enter data processing system A 102. However, if heater 210 is activated for a period of time, local transient heating effects on temperature sensor 206A may preclude it from measuring the temperature of gasses brought into data processing system A 102 until the transient heating effects are mitigated. For example, the housing of temperature sensor 206A may be warmed, or other objects near temperature sensor 206A may be warmed resulting in the temperature measurement by temperature sensor 206A being elevated from that of the ambient environmental temperature.

Turning to FIG. 1C, a plot showing a measured temperature in accordance with an embodiment is shown. In FIG. 1C, the measured temperature may be measured by temperature sensor 206A shown in FIG. 1C.

At time zero (e.g., at the origin of the plot), the data processing system may power on. When powered on, the data processing system may activate its fan and heater to warm temperature sensitive hardware components. As seen in FIG. 1C, the warming may cause the temperature measured by the temperature sensor to increase above the ambient temperature.

While warming the temperature sensitive hardware components, the data processing system may undergo an unexpected restart. The unexpected restart may stop operation of the fan and heater. Consequently, because cool air from the ambient environment stops coming into the data processing system, the temperature sensor may further warm (e.g., as indicated by the peak following the line terminating in an arrow indicating the unexpected restart).

If, during this period of time, a temperature measurement is made, the temperature measurement would not accurately reflect the temperature of gasses that will be drawn into the data processing system by operation of the fan.

To obtain a measurement that reflects the temperature of gasses that will be drawn into the data processing system, the data processing system may perform a calibration procedure. The calibration procedure may include, for example, (i) activating the fan to draw gasses into the ambient environment (which may cool the temperature sensor and/or nearby components resulting in measurements by the temperature sensor converging to temperature of the ambient environment over time, as illustrated by the graph following the peak), (ii) waiting durations of time (e.g., such as the convergence time) before performing temperature measurement, (iii) comparing various temperature measurements to ascertain whether transient thermal effects are still present, and (iv) performing a temperature measurement once the transient thermal effects are sufficiently mitigated (e.g., as defined by a metric such as a threshold related to temperature change, duration of time between initiating operation of the fan and taking a temperature measurement, etc.).

By doing so, the data processing system may mitigate the transient thermal effects caused by heating of hardware components. When mitigated, temperature measurements, reflecting the temperatures upon which various procedures for heating the data processing system are based, may be taken and used to select a procedure that is likely to warm the data processing system as expected.

Turning to FIG. 2, a diagram of an example data processing system 200 in accordance with an embodiment is shown. Data processing system 200 may be similar to any of data processing systems 100.

Data processing system 200 may provide any number and type of computer implemented services. To provide the computer implemented services, data processing system 200 may include various hardware components (e.g., processors, memory modules, storage devices, etc., not shown in FIG. 2).

To manage its own operation, data processing system 200 may include management components (e.g., hardware components) such as management controller 202 and various subsystems such as thermal management subsystem 220. Each of these components is discussed below.

Management controller 202 may manage the operation of data processing system 200. To do so, management controller 202 may monitor the operation of data processing system 200 and take action to remediate undesired operation. As part of its functionality, management controller 202 may manage the operation of thermal management subsystem 220. The operation of management controller 202 may contribute to maintaining the temperatures of temperature sensitive hardware components 120 within their thermal operating ranges.

When providing its functionality, management controller 202 may perform all or a portion of the methods shown in FIGS. 3A-3B.

Generally, management controller 202 may be implemented using an in-band or out-of-band management controller.

Thermal management subsystem 220 may manage the thermal state of various hardware components of data processing system 200. To manage the thermal state of the various hardware components (e.g., temperature sensitive hardware components 120), thermal management subsystem 220 may (i) perform a temperature sensor calibration for temperature sensor 206, (ii) measure a temperature using temperature sensor 206 that reflects an ambient temperature, and/or (iii) perform a procedure based on the measured temperature to warm temperature sensitive hardware components 120. To provide its functionality, thermal management subsystem 220 may include thermal manager 204, temperature sensor 206, and heater 210. Each of these components is discussed below.

Thermal manager 204 may manage the operation of the other components of thermal management subsystem 220.

When providing its functionality, thermal manager 204 may perform all or a portion of the methods shown in FIGS. 3A-3B.

In an embodiment, thermal manager 204 is implemented using a hardware device including circuitry. The hardware device may be, for example, a digital signal processor, a field programmable gate array, or an application specific integrated circuit. The circuitry may be adapted to cause the hardware device to perform the functionality of thermal manager 204. Thermal manager 204 may be implemented using other types of hardware devices without departing embodiment disclosed herein.

In an embodiment, thermal manager 204 is implemented using a processor adapted to execute computing code stored on a persistent storage that when executed by the processor performs the functionality of thermal manager 204 discussed throughout this application. The processor may be a hardware processor including circuitry such as, for example, a central processing unit, a processing core, or a microcontroller. The processor may be other types of hardware devices for processing information without departing embodiment disclosed herein.

Temperature sensor 206 may monitor (e.g., directly, or indirectly) the temperature of gas flows and/or components heated by heater 210 and provide information regarding the temperature to other components such as management controller 202, heater power system 208, and/or other components or devices. Temperature sensor 206 may be implemented with, for example, a thermocouple or other temperature measurement component.

Heater 210 may selectively heat various components of data processing system 200. Heater 210 may be implemented with, for example, a resistive heater and/or a power supply. The power supply and/or resistive heater may be controlled by management controller 202, thermal manager 204, and/or other components.

Temperature sensitive hardware components 120 may provide, at least in part and while operating, computer implemented services. Temperature sensitive hardware components 120 may include any number and type of hardware components (e.g., processors, memory modules, storage devices, communication devices, special purpose devices such as graphics processing units, management components such as in or out of band managers, etc.).

While illustrated in FIG. 2 with a limited number of specific components, a data processing system may include additional, fewer, and/or different components without departing from embodiments disclosed herein.

As discussed above, the components of FIGS. 1A-2 may perform various methods to increase the likelihood of data processing systems being able to provide computer implemented services. FIGS. 3A-3B illustrate examples of methods that may be performed by the components of FIGS. 1A-2. In the diagrams discussed below and shown in these figures, any of the operations may be repeated, performed in different orders, omitted, and/or performed in parallel with or a partially overlapping in time manner with other operations.

Turning to FIG. 3A, a flow diagram illustrating a method of initiating performance of computer implemented services in accordance with an embodiment is shown. The method may be performed, for example, by a data processing system, a thermal manager, a management controller, and/or other components illustrated in FIGS. 1A-2.

At operation 300, a startup of the data processing system is identified. The startup may be identified, for example, monitoring for the data processing system being powered on, restarted, or otherwise initiating performance of the startup.

In an embodiment, upon startup, the operation of temperature sensitive hardware components of the data processing may not be initiated. Rather, the operation of these components may be delayed until it is likely that the temperatures of the temperature sensitive hardware components are within their thermal operating ranges. Due to the environment in which the data processing system may reside, any of the temperature sensitive hardware components may be outside of their thermal operating ranges when the data processing system initiates the startup.

At operation 302, a temperature sensor calibration is performed to eliminate transitory temperature effects (e.g., transitory thermal effects) on temperature measurements from a temperature sensor. Performing the temperature sensor calibration may include (i) initiating operation of a fan to generate a flow of gas from an ambient environment into the data processing system and proximate to the temperature sensor, and (ii) waiting a duration of time while the gas flows proximate to the temperature sensor. Performing the temperature sensor calibration may include other actions without departing from embodiments disclosed herein.

In an embodiment, the temperature sensor calibration is performed using the method illustrated in FIG. 3B. The temperature sensor calibration may be performed via other methods without departing from embodiments disclosed herein.

At operation 304, a temperature measurement is obtained using the calibrated temperature sensor. The temperature measurement may be obtained by reading the calibrated temperature sensor.

At operation 306, a warming procedure based on the temperature measurement is selected. The warming procedure may be selected by matching the temperature measurement to a temperature associated with one (e.g., closest) of the warming procedures.

At operation 308, the selected warming procedure is performed to attempt to warm at least one temperature sensitive hardware component to meet thermal operating limits. The warming procedure may be performed, for example, by operating a heater and a fan at predetermined rates for predetermined amounts of time as indicated by the selected warming procedure.

At operation 310, operation of the temperature sensitive hardware component is initiated after completing the warming procedure. The operation of the temperature sensitive hardware component may be initiated by powering the temperature sensitive hardware component. Initiating operation of the temperature sensitive hardware component may result in the computer implemented services (or a portion thereof) being provided.

The method may end following operation 310.

Using the method illustrated in FIG. 3A, a data processing system in accordance with an embodiment may be more likely to be able to provide desired computer implemented services by improving the likelihood that its components are within their thermal operating ranges.

Turning to FIG. 3B, a flow diagram illustrating a method of performing a temperature sensor calibration in accordance with an embodiment is shown. The method may be performed, for example, by a data processing system, a thermal manager, a management controller, and/or other components illustrated in FIGS. 1A-2.

Prior to operation 320, a heater and fan of the data processing system may be active for a period of time, or may not have been active. Then, the data processing system may initiate performance of a startup which may place the heater of data processing system into an inactive state and the fan may be activated (e.g., as part of the calibration) to initiate flow of gas from an ambient environment (or other source) through the data processing system. The flow of the gas may continue throughout the method shown in FIG. 3B.

At operation 320, a first temperature measurement is obtained using a temperature sensor. The first temperature measurement may be obtained by reading the temperature sensor.

At operation 322, an amount of time is waited. The amount of time may be any amount of time. Waiting the amount of time may cause the temperature sensor and/or other portions of the data processing system proximate to the temperature sensor to undergo thermal exchange with the flow of gas resulting in the local temperature moving towards the ambient temperature.

At operation 324, a second temperature measurement is obtained using the temperature sensor. The second temperature measurement may be obtained by reading the temperature sensor after waiting the amount of time. Thus, there may be a time delta between the two temperature measurements.

At operation 326, a determination is made regarding whether the first temperature measurement and the second temperature measurement indicate that the temperature sensor is impacted by transitory temperature effects. The determination may be made by comparing the two temperature measurements. If the two temperature measurements are the same (or within a threshold of each other), then it may be determined that the temperature sensor is not impacted by transitory temperature effects.

If it is determined that the temperature is impacted by the transitory temperature effects, then the method may return to operation 320 following operation 326. Otherwise, the method may end following operation 326.

If the method proceeds to operation 320, one or two new temperature measurements may be obtained. For example, in operation 320, the second temperature measurement may be used as the first temperature measurement, and a third temperature measurement may be obtained in the second performance of operation 324. In this manner, various comparisons between temperature measurements may be made to ascertain when transitory temperature effects have been mitigated.

Ending following operation 326 may indicate that the transitory temperature effects have been mitigated.

Thus, by using the method illustrated in FIG. 3B, a data processing system may be more likely to accurately ascertain the temperature of gasses that will be drawn into the data processing system and from the ambient environment. Consequently, the data processing system may be more likely to select procedures for performance that will place various temperature sensitive hardware components into condition to operate (e.g., be within thermal operating limits).

Figure 4:
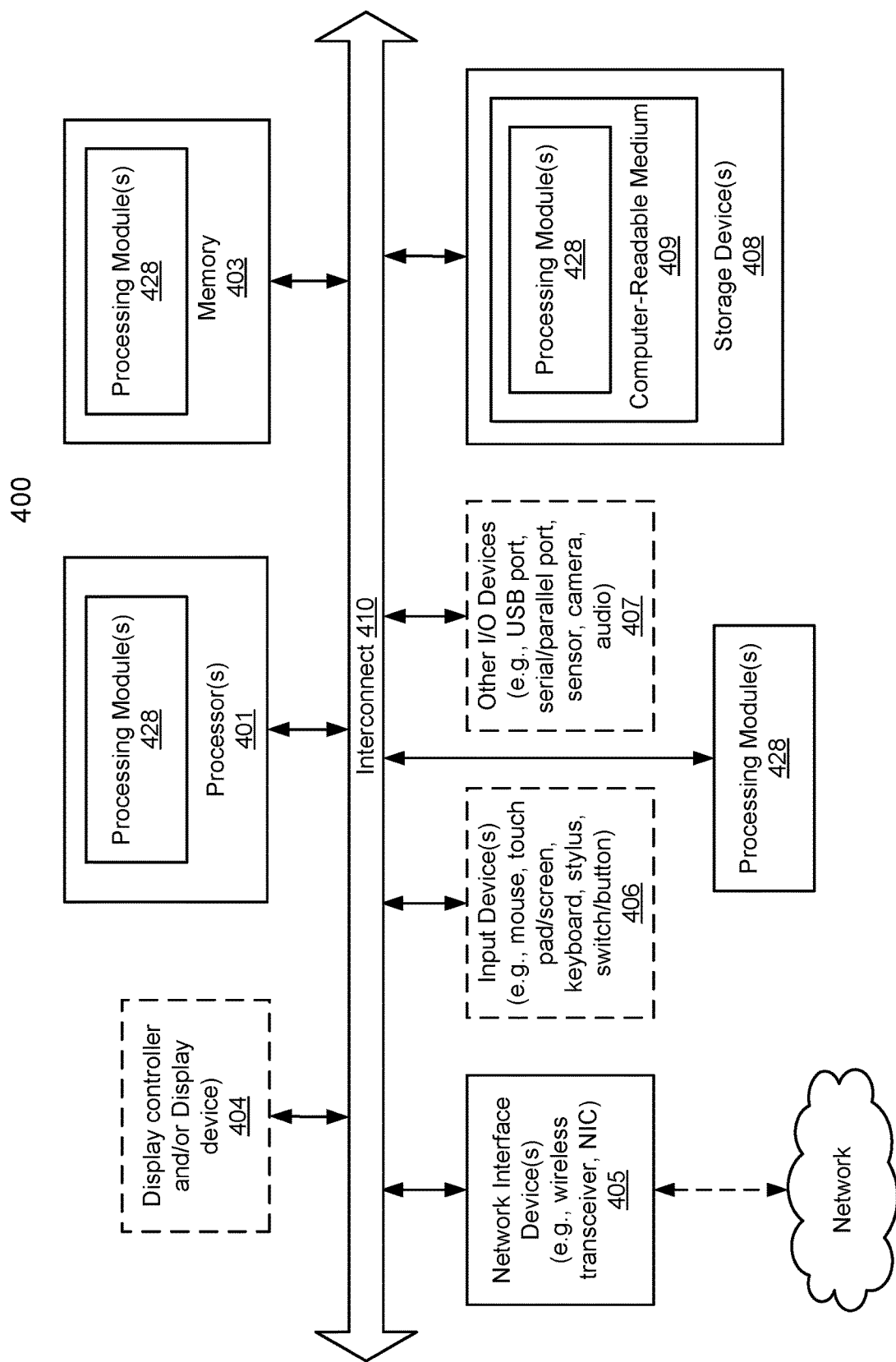
FIG. 4 shows a block diagram illustrating a computing device in accordance with an embodiment.

Any of the components illustrated in FIGS. 1A-2 may be implemented with one or more computing devices. Turning to FIG. 4, a block diagram illustrating an example of a computing device in accordance with an embodiment is shown. For example, system 400 may represent any of the data processing systems and/or computing devices described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-408 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system that provides computer implemented services, the data processing system comprising:
   a heater positioned to, while powered, selectively warm a flow of a gas directed to warm a temperature sensitive hardware component of the data processing system;
   a temperature sensor positioned to identify an ambient temperature;
   a fan adapted to selectively generate the flow of the gas;
   a thermal manager embodied by a processor installed in the data processing system that is adapted to:
      identify, based on one or more operations of the data processing system monitored by the processor, a startup of the data processing system;
      based on the identified startup:
         perform a calibration of the temperature sensor using the fan to eliminate transitory temperature effects on the ambient temperature identified by the temperature sensor to obtain a calibrated temperature sensor;
         obtain a temperature measurement of the ambient temperature using the calibrated temperature sensor;
         select a warming procedure based on the temperature measurement, the warming procedure being stored in and selected from a storage coupled to the processor;
         perform the selected warming procedure using the heater and the fan to attempt to warm at least the temperature sensitive hardware component to meet a predefined thermal operating limit of the temperature sensitive hardware component, the predefined thermal operating limit being stored in and obtained from the storage or being obtained by the processor from one or more sources external to the data processing system; and
         initiate operation of the temperature sensitive hardware component after completing the warming procedure to provide, at least in part, the computer implemented services.

2. The data processing system of claim 1, wherein the thermal manager is further adapted to:
   prior to identifying the startup of the data processing system:

attempt to perform a previously selected warming procedure until an unexpected operation of the data processing system aborts the performance of the previously selected warming procedure, the previously selected warming procedure introducing the transitory temperature effects on the ambient temperature identified by the temperature sensor.

3. The data processing system of claim 2, wherein the unexpected operation initiates performance of the startup of the data processing system.

4. The data processing system of claim 1, wherein performing the calibration of the temperature sensor comprises:
activating the fan to generate the flow of the gas; and
waiting a predetermination duration of time while the heater is inactive and the flow of the gas traverses proximate to a portion of the data processing system positioned with the temperature sensor to cool the portion of the data processing system to the ambient temperature.

5. The data processing system of claim 1, wherein performing the calibration of the temperature sensor comprises:
activating the fan to generate the flow of the gas;
obtaining a first calibration temperature measurement using the temperature sensor while the flow of the gas is generated and the heater is inactive;
waiting a period of time while the heater is inactive and the flow of the gas traverses proximate to a portion of the data processing system positioned with the temperature sensor to attempt to cool the portion of the data processing system to the ambient temperature;
after waiting the period of time, obtaining a second calibration temperature measurement using the temperature sensor; and
making a determination regarding whether the transitory temperature effect has been mitigated to a desired degree based on the first calibration temperature measurement and the second calibration temperature measurement.

6. The data processing system of claim 5, wherein performing the calibration of the temperature sensor further comprises:
in a first instance of the determination where the transitory temperature effect has not been mitigated:
waiting a second period of time while the heater is inactive and the flow of the gas traverses proximate to the portion of the data processing system positioned with the temperature sensor to attempt to cool the portion of the data processing system to the ambient temperature;
after waiting the second period of time, obtaining a third calibration temperature measurement using the temperature sensor; and
making a second determination regarding whether the transitory temperature effect has been mitigated to the desired degree based on the second calibration temperature measurement and the third calibration temperature measurement.

7. The data processing system of claim 1, wherein selecting the warming procedure based on the temperature measurement comprises:
matching a temperature indicated by the temperature measurement to the warming procedure from a plurality of warming procedures, each of the warming procedures of the plurality of warming procedures being associated with a corresponding temperature, and each of the procedures of the plurality of warming procedures being based on a presumption that the ambient temperature matches the temperature indicated by the temperature measurement.

8. A computer-implemented method for providing computer implemented services with a data processing system, the method being performed by at least a processor of the data processing system and comprising:
identifying, based on one or more operations of the data processing system monitored by the processor a startup of the data processing system;
based on the identified startup:
performing a calibration of a temperature sensor using a fan to eliminate transitory temperature effects on an ambient temperature identified by the temperature sensor to obtain a calibrated temperature sensor, the temperature sensor being positioned to identify the ambient temperature;
obtaining a temperature measurement of the ambient temperature using the calibrated temperature sensor;
selecting a warming procedure based on the temperature measurement, the warming procedure being stored in and selected from a storage coupled to the processor;
performing the selected warming procedure using a heater and the fan to attempt to warm at least a temperature sensitive hardware component to meet a thermal operating limit of the temperature sensitive hardware component of the data processing system, the heater being positioned to, while powered, selectively warm a flow of a gas directed to warm the temperature sensitive hardware component, and the fan being adapted to selectively generate the flow of the gas, and the predefined thermal operating limit being stored in and obtained from the storage or being obtained by the processor from one or more sources external to the data processing system; and
initiating operation of the temperature sensitive hardware component after completing the warming procedure to provide, at least in part, the computer implemented services.

9. The computer-implemented method of claim 8, further comprising:
prior to identifying the startup of the data processing system:
attempt to perform a previously selected warming procedure until an unexpected operation of the data processing system aborts the performance of the previously selected warming procedure, the previously selected warming procedure introducing the transitory temperature effects on the ambient temperature identified by the temperature sensor.

10. The computer-implemented method of claim 9, wherein the unexpected operation initiates performance of the startup of the data processing system.

11. The computer-implemented method of claim 8, wherein performing the calibration of the temperature sensor comprises:
activating the fan to generate the flow of the gas; and
waiting a predetermination duration of time while the heater is inactive and the flow of the gas traverses proximate to a portion of the data processing system positioned with the temperature sensor to cool the portion of the data processing system to the ambient temperature.

12. The computer-implemented method of claim 8, wherein performing the calibration of the temperature sensor comprises:

activating the fan to generate the flow of the gas;

obtaining a first calibration temperature measurement using the temperature sensor while the flow of the gas is generated and the heater is inactive;

waiting a period of time while the heater is inactive and the flow of the gas traverses proximate to a portion of the data processing system positioned with the temperature sensor to attempt to cool the portion of the data processing system to the ambient temperature;

after waiting the period of time, obtaining a second calibration temperature measurement using the temperature sensor; and making a determination regarding whether the transitory temperature effect has been mitigated to a desired degree based on the first calibration temperature measurement and the second calibration temperature measurement.

13. The computer-implemented method of claim 12, wherein performing the calibration of the temperature sensor further comprises:

in a first instance of the determination where the transitory temperature effect has not been mitigated:

waiting a second period of time while the heater is inactive and the flow of the gas traverses proximate to the portion of the data processing system positioned with the temperature sensor to attempt to cool the portion of the data processing system to the ambient temperature;

after waiting the second period of time, obtaining a third calibration temperature measurement using the temperature sensor; and making a second determination regarding whether the transitory temperature effect has been mitigated to the desired degree based on the second calibration temperature measurement and the third calibration temperature measurement.

14. The computer-implemented method of claim 8, wherein selecting the warming procedure based on the temperature measurement comprises:

matching a temperature indicated by the temperature measurement to the warming procedure from a plurality of warming procedures, each of the warming procedures of the plurality of warming procedures being associated with a corresponding temperature, and each of the procedures of the plurality of warming procedures being based on a presumption that the ambient temperature matches the temperature indicated by the temperature measurement.

15. A non-transitory machine-readable medium having instructions stored therein, which when executed by a processor of a data processing system that provides computer implemented services, causes the processor to perform operations comprising:

identifying, based on one or more operations of the data processing system monitored by the processor, a startup of the data processing system;

based on the identified startup:

performing a calibration of a temperature sensor using a fan to eliminate transitory temperature effects on an ambient temperature identified by the temperature sensor to obtain a calibrated temperature sensor, the temperature sensor being positioned to identify the ambient temperature;

obtaining a temperature measurement of the ambient temperature using the calibrated temperature sensor;

selecting a warming procedure based on the temperature measurement, the warming procedure being stored in and selected from a storage coupled to the processor;

performing the selected warming procedure using a heater and the fan to attempt to warm at least a temperature sensitive hardware component to meet a thermal operating limit of the temperature sensitive hardware component of the data processing system, the heater being positioned to, while powered, selectively warm a flow of a gas directed to warm the temperature sensitive hardware component, and the fan being adapted to selectively generate the flow of the gas, and the predefined thermal operating limit being stored in and obtained from the storage or being obtained by the processor from one or more sources external to the data processing system; and initiating operation of the temperature sensitive hardware component after completing the warming procedure to provide, at least in part, the computer implemented services.

16. The non-transitory machine-readable medium of claim 15, wherein the operations further comprise:

prior to identifying the startup of the data processing system:

attempt to perform a previously selected warming procedure until an unexpected operation of the data processing system aborts the performance of the previously selected warming procedure, the previously selected warming procedure introducing the transitory temperature effects on the ambient temperature identified by the temperature sensor.

17. The non-transitory machine-readable medium of claim 16, wherein the unexpected operation initiates performance of the startup of the data processing system.

18. The non-transitory machine-readable medium of claim 15, wherein performing the calibration of the temperature sensor comprises:

activating the fan to generate the flow of the gas; and waiting a predetermination duration of time while the heater is inactive and the flow of the gas traverses proximate to a portion of the data processing system positioned with the temperature sensor to cool the portion of the data processing system to the ambient temperature.

19. The non-transitory machine-readable medium of claim 15, wherein performing the calibration of the temperature sensor comprises:

activating the fan to generate the flow of the gas;

obtaining a first calibration temperature measurement using the temperature sensor while the flow of the gas is generated and the heater is inactive;

waiting a period of time while the heater is inactive and the flow of the gas traverses proximate to a portion of the data processing system positioned with the temperature sensor to attempt to cool the portion of the data processing system to the ambient temperature;

after waiting the period of time, obtaining a second calibration temperature measurement using the temperature sensor; and making a determination regarding whether the transitory temperature effect has been mitigated to a desired degree based on the first calibration temperature measurement and the second calibration temperature measurement.

20. The non-transitory machine-readable medium of claim 19, wherein performing the calibration of the temperature sensor further comprises:
- in a first instance of the determination where the transitory temperature effect has not been mitigated:
- waiting a second period of time while the heater is inactive and the flow of the gas traverses proximate to the portion of the data processing system positioned with the temperature sensor to attempt to cool the portion of the data processing system to the ambient temperature;
- after waiting the second period of time, obtaining a third calibration temperature measurement using the temperature sensor; and
- making a second determination regarding whether the transitory temperature effect has been mitigated to the desired degree based on the second calibration temperature measurement and the third calibration temperature measurement.

* * * * *